(12) United States Patent
Kadota et al.

(10) Patent No.: US 7,194,793 B2
(45) Date of Patent: Mar. 27, 2007

(54) METHOD FOR PRODUCING AN EDGE REFLECTION TYPE SURFACE ACOUSTIC WAVE DEVICE

(75) Inventors: Michio Kadota, Kyoto (JP); Yasunori Takakuwa, Kanazawa (JP); Seigo Hayashi, Komatsu (JP); Junya Ago, Nagaokakyo (JP); Hideya Horiuchi, Nagaokakyo (JP); Mamoru Ikeura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 215 days.

(21) Appl. No.: 10/844,940

(22) Filed: May 13, 2004

(65) Prior Publication Data

US 2004/0261250 A1   Dec. 30, 2004

Related U.S. Application Data

(62) Division of application No. 09/940,988, filed on Aug. 28, 2002, now abandoned.

(30) Foreign Application Priority Data

Sep. 6, 2000   (JP) .............................. 2000-270586

(51) Int. Cl.
*H04R 31/00* (2006.01)

(52) U.S. Cl. .................... 29/594; 29/25.35; 29/597; 29/609.1; 216/39; 216/41; 310/313; 310/320; 310/366; 333/150; 333/187; 333/193; 333/195; 333/196

(58) Field of Classification Search .............. 29/25.35, 29/594, 597, 602.1, 609; 216/39, 41; 310/313, 310/320, 366; 333/150, 187, 193, 195, 196
See application file for complete search history.

(56) References Cited

U.S. PATENT DOCUMENTS

| | | | | | |
|---|---|---|---|---|---|
| 5,099,459 | A | * | 3/1992 | Smith | 367/153 |
| 5,283,037 | A | * | 2/1994 | Baer et al. | 422/82.01 |
| 5,684,437 | A | * | 11/1997 | Ago et al. | 333/195 |
| 5,714,830 | A | * | 2/1998 | Kadota et al. | 310/313 A |
| 5,802,685 | A | | 9/1998 | Kadota et al. | |
| 5,838,217 | A | | 11/1998 | Kadota et al. | |
| 5,914,554 | A | | 6/1999 | Kadota et al. | |

(Continued)

FOREIGN PATENT DOCUMENTS

| | | |
|---|---|---|
| EP | 0 751 615 A1 | 1/1997 |
| JP | 60-41809 | 3/1985 |

(Continued)

*Primary Examiner*—Paul D. Kim
(74) *Attorney, Agent, or Firm*—Keating & Bennett, LLP

(57) ABSTRACT

A method for adjusting a frequency characteristic of an edge reflection type surface acoustic wave device includes the step of obtaining a frequency characteristic of an edge reflection type surface acoustic wave device having a piezoelectric substrate. The edge reflection type surface acoustic wave device has a pair of edges of the piezoelectric substrate which define a predetermined distance therebetween. The piezoelectric substrate is cut at a position which defines a distance that is shorter than the predetermined distance when a final frequency characteristic of the edge reflection type surface acoustic wave device is to be higher than the obtained frequency characteristic. The piezoelectric substrate is cut at a position which defines a distance that is longer than the predetermined distance when a final frequency characteristic of the edge reflection type surface acoustic wave device is to be lower than the obtained frequency characteristic.

12 Claims, 10 Drawing Sheets

U.S. PATENT DOCUMENTS

| | | |
|---|---|---|
| 5,977,686 A | 11/1999 | Kadota et al. |
| 6,127,769 A | 10/2000 | Kadota et al. |

FOREIGN PATENT DOCUMENTS

| | | | |
|---|---|---|---|
| JP | 60211674 A | * | 10/1985 |
| JP | 61-6919 | | 1/1986 |
| JP | 62-071317 A | | 4/1987 |
| JP | 5-145370 | | 6/1993 |
| JP | 5-183376 | | 7/1993 |
| JP | 07-307640 A | | 11/1995 |
| JP | 08-046467 | | 2/1996 |
| JP | 09-186553 | | 7/1997 |
| JP | 2000-59175 | | 2/2000 |
| JP | 2000-156620 | | 6/2000 |

* cited by examiner

METHOD FOR PRODUCING AN EDGE REFLECTION TYPE SURFACE ACOUSTIC WAVE DEVICE

This application is a Divisional application of patent Ser. No. 09/940,988 filed Aug. 28, 2002, now abandoned.

BACKGROUND OF THE INVENTION

1. Field of the Invention

The present invention relates to a method for producing an edge reflection type surface wave device for use in a band pass filter, a trap or other suitable device, and a method for adjusting a resonance frequency of an edge reflection type surface wave device.

2. Description of the Related Art

As disclosed in, for example, Japanese Unexamined Patent Application Publications No. 5-183376 and No. 5-145370, various edge reflection type surface wave devices which utilize a Shear Horizontal (SH) type surface wave such as a BGS wave have been previously proposed.

In an edge reflection type surface wave device, an interdigital transducer is disposed on a piezoelectric substrate having two opposing edges. A plurality of electrode fingers in the interdigital transducer are extended in the direction parallel to the edges. An excited surface acoustic wave is reflected between the two opposing edges, a standing wave occurs, and the resonance characteristic based on the standing wave is utilized.

Since the edge reflection type surface wave device requires no reflector, it allows for miniaturization of a surface wave device.

For the production of the above-described edge reflection type surface wave device, a wafer made of a piezoelectric material is prepared. Then, a plurality of interdigital transducers are formed on the wafer. Next, the wafer is cut, two opposing edges thereof are formed, and a plurality of edge reflection type surface wave devices is cut out from the single wafer.

In the edge reflection type surface wave device, unless the two opposing edges are correctly formed, desired resonance characteristic and filter characteristic cannot be achieved. Therefore, when forming edges using a single electrode type interdigital transducer, each of the edges has been previously cut out at the position spaced apart by $\lambda/2$ or an integral multiple of $\lambda/2$, outward in the propagation direction of a surface acoustic wave, from the center of the electrode finger adjacent to each of the outermost electrode fingers. On the other hand, when forming edges using a double electrode type interdigital transducer including a pair of electrode finger portions, each of the edges has been cut out at the position spaced apart by an integral multiple of $\lambda/2$, in the propagation direction of a surface acoustic wave, outward from the center between the pair of electrode finger portions of the electrode finger adjacent to each of the electrode fingers which are disposed on the outermost sides of the interdigital transducer in the propagation direction of a surface acoustic wave.

In an actual manufacturing process, a plurality of edge reflection type surface wave devices is cut out from a wafer. Also, when mass-producing edge reflection type surface wave devices, interdigital transducers have been formed on each of a plurality of wafers in the same manner, and the plurality of wafers have been cut from above.

However, even if a plurality of wafers are prepared, as well as a plurality of interdigital transducers are formed in the same manner, and edges are formed with high accuracy by cutting, a problem occurs in that the frequency characteristics vary among the numerous edge reflection type surface wave devices obtained. This is because the piezoelectric characteristics vary from wafer to wafer.

SUMMARY OF THE INVENTION

In order to overcome the problems described above, preferred embodiments of the present invention provide a method for manufacturing an edge reflection type surface wave device so as to eliminate variations in the frequency characteristics among the edge reflection type surface wave devices produced, and allowing a desired frequency characteristic to be realized.

The method for adjusting a frequency characteristic of an edge reflection type surface acoustic wave device according to a preferred embodiment of the present invention includes the step of determining a frequency characteristic of an edge reflection type surface acoustic wave device having a piezoelectric substrate. The edge reflection type surface acoustic wave device has a pair of edges of the piezoelectric substrate which define a predetermined distance therebetween. The piezoelectric substrate is cut at at least one of a pair of positions which define a distance that is shorter than the predetermined distance when a final frequency characteristic of the edge reflection type surface acoustic wave device is to be higher than the determined frequency characteristic, and is cut at at least one of a pair of positions which define a distance that is longer than the predetermined distance when a final frequency characteristic of the edge reflection type surface acoustic wave device is to be lower than the determined frequency characteristic.

The positions at which the piezoelectric substrate is cut in the piezoelectric substrate cutting step is preferably shifted from positions of the edges which define the predetermined distance in the frequency characteristic determining step by about $\lambda/8$ or less and more preferably by about $\lambda/16$, where the $\lambda$ is wavelength of a shear horizontal type surface wave to be excited in the edge reflection type surface acoustic wave device.

The edge reflection type surface acoustic wave device may include a single electrode type interdigital transducer. In this case, the positions of the edges which define the predetermined distance are preferably located at approximate centers of electrodes.

Alternatively, the edge reflection type surface acoustic wave device may include a double electrode type interdigital transducer. In this case, each of the positions of the edges which defines the predetermined distance is located at an approximate center of a pair of electrode fingers constituting a double electrode.

According to another preferred embodiment of the present invention, the method for producing an edge reflection type surface acoustic wave device which includes at least one interdigital transducer and utilizes a shear horizontal type surface wave, includes the steps of forming a plurality of interdigital transducers on a piezoelectric substrate, cutting the piezoelectric substrate and producing a reference edge reflection type surface acoustic wave device including at least one of the interdigital transducers and a pair of edges of the piezoelectric substrate, the pair of edges defining a predetermined distance therebetween, measuring a frequency characteristic of the reference edge reflection type surface acoustic wave, determining positions of a pair of edges defining each of remaining edge reflection type surface acoustic wave devices based on the measured frequency characteristic, and cutting the piezoelectric substrate at the determined positions to produce the remaining edge reflection type surface acoustic wave devices.

In the position determining step, a distance between the pair of edges of the remaining edge reflection type surface acoustic wave devices is preferably made shorter than the predetermined distance when a final frequency characteristic of the remaining edge reflection type surface acoustic wave devices is to be higher than the measured frequency characteristic, and a distance between the pair of edges of the remaining edge reflection type surface acoustic wave devices is preferably made longer than the predetermined distance when a final frequency characteristic of the remaining edge reflection type surface acoustic wave devices is to be lower than the measured frequency characteristic.

The above and other elements, characteristics, features, and advantages of the present invention will be clear from the following detailed description of preferred embodiments of the present invention in conjunction with the accompanying drawings.

DETAILED DESCRIPTION OF PREFERRED EMBODIMENTS

Figure 1:
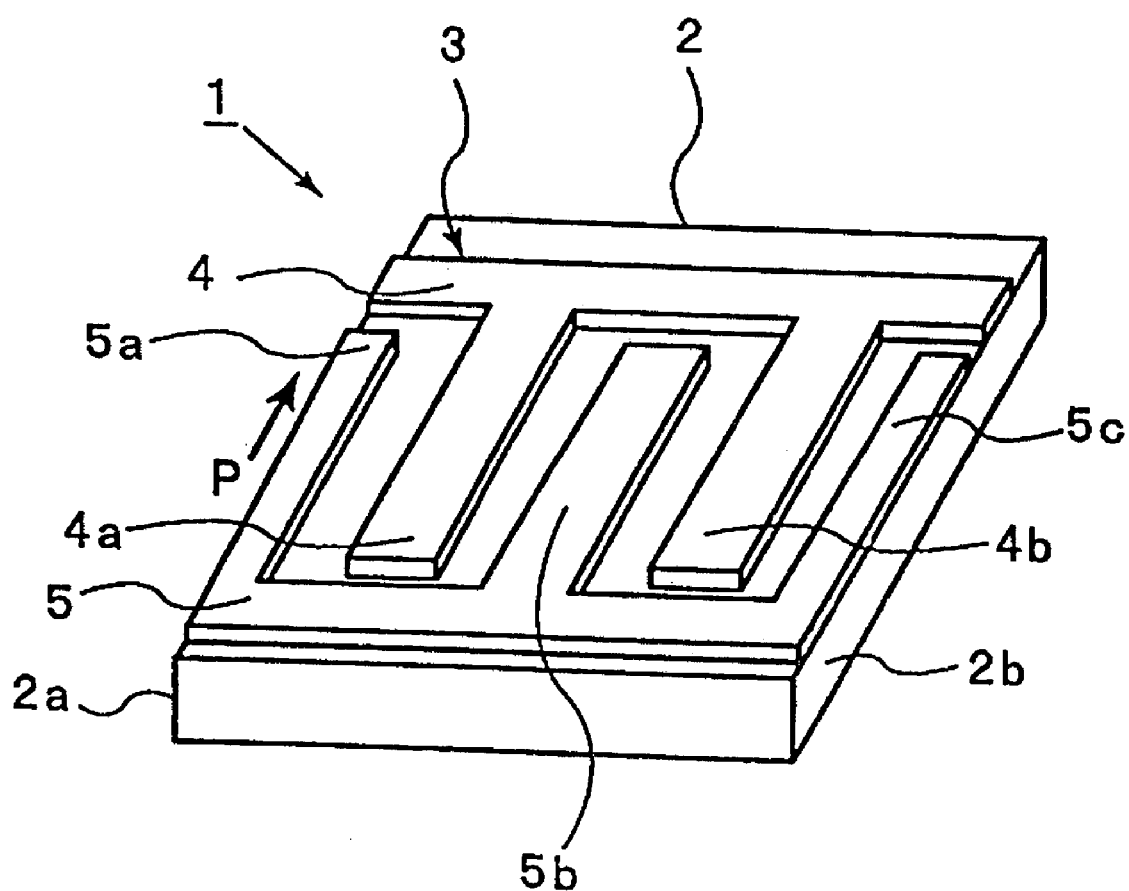
FIG. 1 is a perspective view showing an edge reflection type surface wave device in accordance with a first preferred embodiment of the present invention.

FIG. 1 is a perspective view showing an example of edge reflection type surface wave device in accordance with a first preferred embodiment of the present invention. The edge reflection type surface wave device 1 in accordance with this preferred embodiment is preferably an edge reflection type surface wave device utilizing a BGS wave as an SH type surface wave.

The edge reflection type surface wave device 1 has a piezoelectric substrate 2 having a substantially rectangular plate shape. The piezoelectric substrate 2 is preferably made of a piezoelectric single crystal such as $LiNbO_3$, $LiTaO_3$, or a piezoelectric ceramic such as a lead titanate zirconate-based ceramic (PZT). When the piezoelectric substrate 2 is a piezoelectric ceramic, the piezoelectric substrate 2 is subjected to a polarization process in the direction of the arrow P shown in FIG. 1. The piezoelectric substrate 2 has end surfaces 2a and 2b that are substantially parallel with each other.

An interdigital transducer 3 is disposed on the top surface of the piezoelectric substrate 2. The interdigital transducer 3 has a pair of comb-shaped electrodes 4 and 5 which are preferably made of a suitable metallic material such as Al. The comb-shaped electrodes 4 and 5 have a plurality of electrode fingers 4a and 4b, and 5a to 5c, respectively. In the interdigital transducer 3, the width of each of the electrode fingers 5a and 5c which are located on the outermost sides in the propagation direction of a surface wave, is preferably about $\lambda/8$. Here, $\lambda$ denotes a wavelength of an excited surface wave.

The width of each of the remaining electrode fingers 4a, 4b, and 5b is preferably about $\lambda/4$. The gap between electrode fingers is preferably about $\lambda/4$.

A distance between the end surface 2a and 2b is preferably about $\lambda/2 \times N$, where $\lambda$ is a wavelength of a surface acoustic wave to be excited by the interdigital transducer 3 and N is an integer greater than one so that the excited wave becomes a standing wave between the end surfaces 2a and 2b.

In the manufacturing method for the edge reflection type surface wave device 1 in accordance with this preferred embodiment, firstly a wafer for forming the piezoelectric substrate 2 is prepared. Specifically, a large-sized wafer constructed of the above-described piezoelectric single crystal or piezoelectric ceramic is prepared, and a plurality of interdigital transducers 3 is disposed on the wafer in order to configure a plurality of edge reflection type surface wave devices 1.

Next, the end surfaces 2a and 2b are formed by cutting the wafer in the thickness, and thus the edge reflection type surface wave device 1 is cut out. In the case, the distance between the end surfaces 2a and 2b is set at a designed value so that the edge reflection type surface wave device 1 has a designed characteristics including a resonance frequency.

As described above, however, the piezoelectric characteristics vary from wafer to wafer, and consequently, when numerous edge reflection type surface wave devices 1 are obtained from a plurality of wafers, the resonance characteristics vary among these edge reflection type surface wave devices.

Accordingly, in this preferred embodiment, firstly a pair of edges 2a and 2b are formed by cutting out from a wafer at the designed positions, thereby the two opposing edges of a single edge reflection type surface wave device are formed, and the frequency characteristic, especially a resonance frequency of the edge reflection type surface wave device 1 with the edges formed, are measured. Thus, other edge reflection type surface wave devices to be cut out from the remaining portion of the wafer are presumed to have the same measured frequency characteristics by cutting out from a wafer at the designed positions. When the frequency characteristic thus measured deviates from a desired one, the cutting positions of the two opposing edges are changed so as to correct the deviation, and then two opposing edges of each of the edge reflection type surface wave devices configured at the remaining portion of the wafer, are formed by cutting.

Specifically, an adjustment of the frequency is performed by adjusting the forming position of the edges, i.e., a distance between the edges. Conventionally, the actual position of the edges 2a and 2b are determined to be identical to the designed position of the edges 2a and 2b that give a distance of about $\lambda/2 \times N$. In contrast, in preferred embodiments of the present invention, the actual positions of the edges 2a and 2b are set at the inside or outside of the designed position in the propagation direction of a surface acoustic wave so that the distance between the actual edges 2a and 2b may be either longer than or shorter than the designed position of the edges 2a and 2b that give a distance of about $\lambda/2 \times N$, thereby a resonance frequency is adjusted.

This may be explained with reference to the relative position from the position of an inner next electrode finger adjacent to the outermost electrode finger. More specifically, each of the positions of 2a and 2b has been conventionally set at position spaced apart by $\lambda/2$, outward in the propagation direction of a surface acoustic wave, from the center of each of the electrode fingers 4a and 4b adjacent to the outermost electrode fingers 5a and 5c. In contrast, in this preferred embodiment, each of the two opposing edges is formed by performing cutting at a position on the inside or outside of the designed position, which is the position spaced apart by about $\lambda/2$ from the center of each of the electrode fingers 4a and 4b, outward in the propagation direction of a surface acoustic wave.

Figure 2:
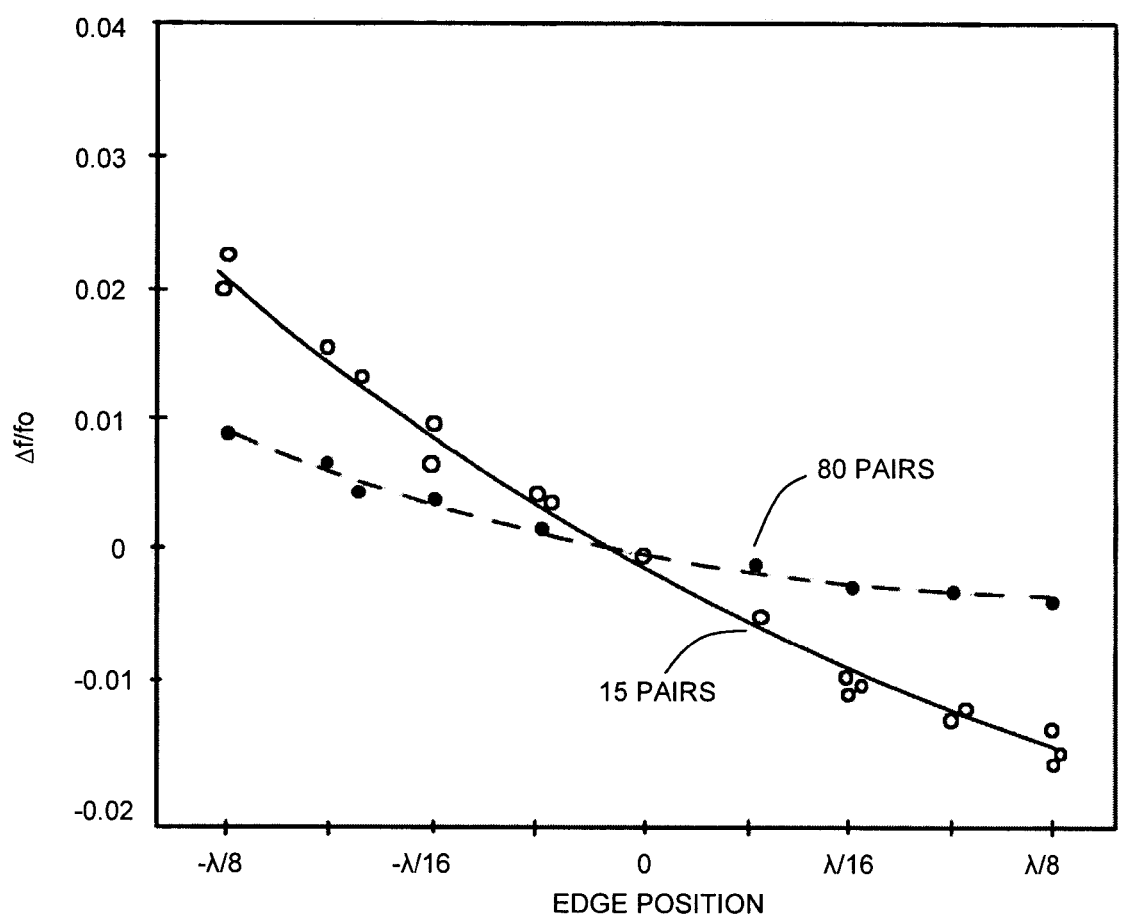
FIG. 2 is a diagram showing the relationship between the amount that the edge formed by cutting is shifted from the designed position, and the ratio of the deviation amount Δf of the measured resonant frequency from the target resonant frequency f with respect to the target resonant frequency f, in the first preferred embodiment.

FIG. 2 shows the variation in the resonant frequency of the edge reflection type surface wave device 1 when the edge 2b is formed at positions shifted outwardly from the designed position, which is spaced apart by about $\lambda/2$ from the center of the electrode finger 4b, in an edge reflection type surface wave device 1 having fifteen pairs of electrodes and eighty pairs of electrode, respectively. The results shown in FIG. 2 are obtained from the experiments wherein fifteen pairs and eighty pairs of electrode fingers are disposed on a piezoelectric substrate made of PZT, in the edge reflection type surface wave device 1, and wherein $\lambda$ is about 58 μm. It is to be noted that the term "pair" referred to one electrode finger belonging to the comb-shaped electrode 4 and one electrode finger belonging to the comb-shaped electrode 5 which are adjacent with each other.

The vertical axis in FIG. 2 represents the ratio $\Delta f/f$ of the deviation amount $\Delta f = f_1 - f$ of the measured resonant frequency $f_1$ from the target resonant frequency $f$ with respect to the target resonant frequency $f$. The "0" on the horizontal axis represents the designed position, which is spaced apart by $\lambda/2$ from the center of the electrode finger 4b, outward in the propagation direction of a surface acoustic wave. "The edge position" on the horizontal axis refers to an edge forming position when the designed position is set at the origin (that is, 0). Here, the "+" direction from the designed position 0 means that an edge is formed outside the designed position in the propagation direction of a surface acoustic wave.

It is to be noted that FIG. 2 indicates the results when both the edge 2a and the edge 2b are formed with the same shift amount and in the same direction. It is preferable that both the edge 2a and the edge 2b are formed with the same shift amount and in the same direction so that the edge reflection type surface wave device is symmetric with respect to a center line that is substantially parallel to electrode fingers of the interdigital lines. However, it is possible to shift a resonance frequency only by shifting either the edge 2a or the edge 2b from the respective designed position.

As can be seen from FIG. 2, the resonant frequency deviates by shifting the forming position of each of the edges 2a and 2b from the designed position. In particular, it is recognized that the frequency is adjusted so that the resonant frequency becomes lower when each of the edges is formed by cutting the piezoelectric substrate outside the designed position so that the distance between the edges 2a and 2b becomes larger than the designed value of approximately $\lambda/2 \times N$, and that the frequency is adjusted so that the resonant frequency becomes higher when each of the edges is positioned inside the designed position in the propagation direction of a surface wave so that the distance between the edges 2a and 2b becomes smaller than the designed value of approximately $\lambda/2 \times N$.

In this way, the resonant frequency can be adjusted by performing cutting at a position shifted from the designed position outward or inward along the propagation direction of a surface wave.

Accordingly, according to preferred embodiments of the present invention, a calibration which indicates the frequency shift with respect to positional shift from the designed position of the edges such as FIG. 2 is first obtained through an experiment. Then, a reference edge reflection type surface wave device having a pair of edges 2a and 2b formed by cutting out from a wafer at the designed positions and a resonance frequency of the reference edge reflection type surface wave device is measured.

Thereafter, a deviation of the measured resonance frequency from a designed resonance frequency is calculated, and a positional shift amount and the direction of the shift are obtained form the calibration based on the difference so that the difference is canceled. In this way, an edge reflection type surface wave device having an intended resonant frequency can be achieved with reliability.

Figure 3:
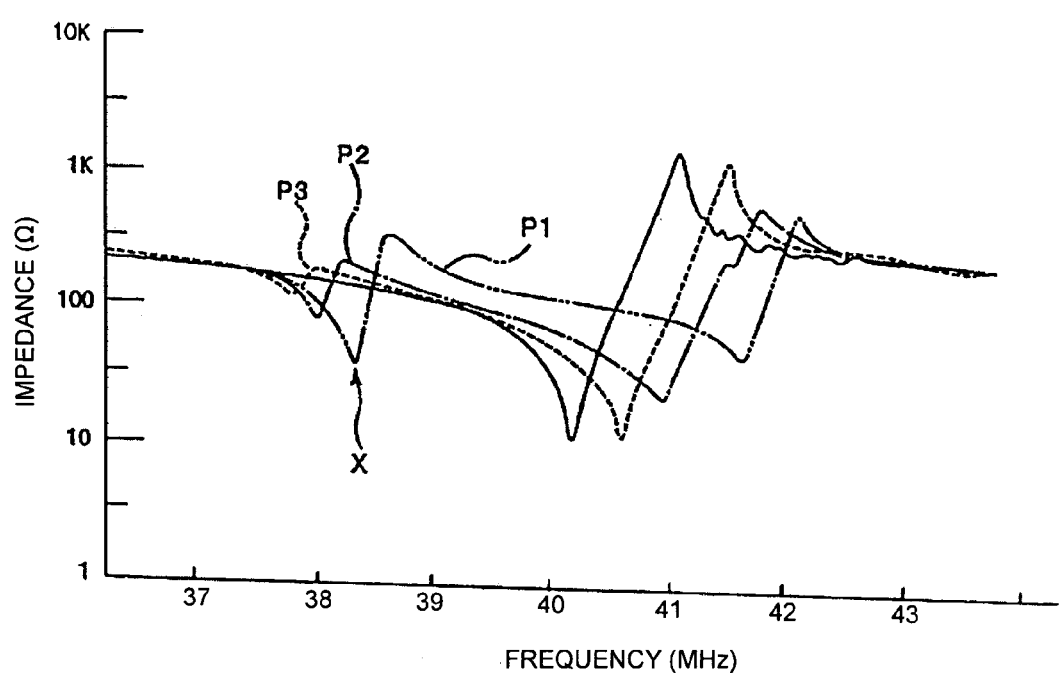
FIG. 3 is a diagram showing frequency characteristics when the positions of the edge are the designed position of $-\lambda/4$, the designed position of $-\lambda/8$, and the designed position of $-\lambda/16$, in the first preferred embodiment.

It is to be noted that, when the forming position of each of the edges 2a and 2b are shifted too much from the designed position outward or inward, not only the impedance ratio of the resonance characteristic decreases, but also unwanted spurious response occurs in the frequency characteristic. The characteristic indicated by the arrow P1 in FIG. 3 shows the frequency characteristic when each of the edges 2a and 2b is formed at the position shifted from the designed position by about λ/4 inward along the propagation direction of a surface acoustic wave. When each of the edges is formed at a position shifted from the designed position inward beyond the range of about ±λ/8, a significant spurious response indicated by the arrow X in the figure occurs in the frequency characteristic. On the other hand, when each of the edges is formed at a position shifted from the designed position outward beyond the range of about ±λ/8, the resonant frequency is different from the above-described case, but the level of the spurious response is equal thereto.

The arrow P2 in FIG. 3 indicates the frequency characteristic when the forming position of each of the edges is within the range of the designed positions of about ±λ/8, for example, at the designed position of about −λ/8. It can be seen that the spurious response marked by "X" in P1 shown in FIG. 3 has been significantly reduced.

It is therefore recognized that the spurious response can be effectively suppressed by forming each of the edges at a position within the range of the designed position of about ±λ/8, and that the resonant frequency can be adjusted with ease and reliability as evident from FIG. 2.

More preferably, each of the edges 2a and 2b is formed within the range of the designed position of about ±λ/16. The arrow P3 in FIG. 3 indicates the frequency characteristic when each of the edges 2a and 2b is formed at the position of the designed positions of about −λ/16. As can be seen from the comparison with the characteristic indicated by the arrow P2 in FIG. 3, in the characteristic indicated by the arrow P3, the above-described spurious response is suppressed more effectively.

The edge reflection type surface wave device 1 shown in FIG. 1 is an application example of a surface wave resonator including a single electrode type interdigital transducer 3. The present invention, however, can also be applied to a method for manufacturing a surface wave device which includes a double electrode type interdigital transducer having a pair of electrode finger portions.

Figure 4:
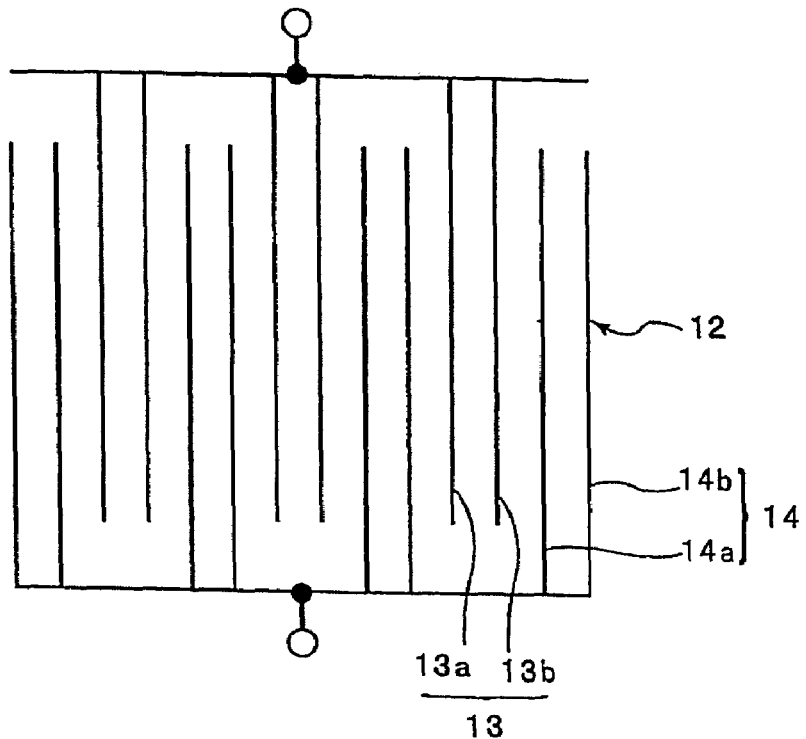
FIG. 4 is a schematic plan view showing the electrode configuration of an edge reflection type surface wave device in accordance with a second preferred embodiment of the present invention.

FIG. 4 is a schematic plan view showing the electrode configuration of an edge reflection type surface wave device 11 having a double electrode type interdigital transducer 12 in accordance with a second preferred embodiment of the present invention.

The interdigital transducer 12 has a plurality of electrode fingers. Each of the electrode fingers has a double electrode (or split electrode) configuration wherein a pair of electrode finger portions are provided. For example, the electrode fingers 13 and 14 of the interdigital transducer 12 in FIG. 4 are configured so that electrode finger portions 13a and 13b, and 14a and 14b define pairs, respectively.

In this preferred embodiment, the position spaced apart by about λ/2, outward in the propagation direction of a surface acoustic wave, from the center of the electrode 13, i.e., the center of the electrode finger portions 13a and 13b adjacent to the outermost electrode finger 14 in the propagation direction of a surface acoustic wave, is set to be a designed position, and an edge is formed by performing cutting at a position within the range of about ±λ/8 from the designed position.

Figure 5:
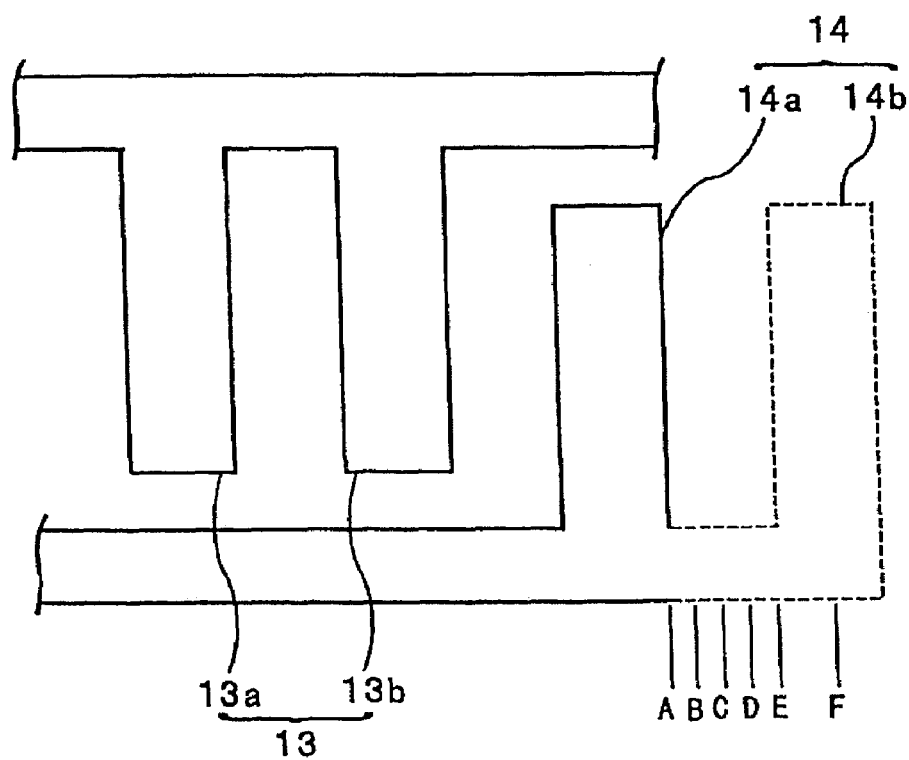
FIG. 5 is a partially enlarged plan view explaining the cutting position at which an edge is formed, in the edge reflection type surface wave device in accordance with a second preferred embodiment shown in FIG. 4.

FIG. 5 is an enlarged partial cutaway plan view showing the portion where an edge is to be formed outside the electrode fingers 13 and 14 of the interdigital transducer 12 shown in FIG. 4, in the propagation direction of a surface acoustic wave.

More specifically, the interdigital transducer 12 is configured so that the electrode finger 13 thereof has a pair of electrode finger portions 13a and 13b and that the outermost electrode finger 14 thereof has a pair of electrode finger portions 14a and 14b. When attempting to perform cutting for forming the edge reflection type surface wave device 11 from a wafer, the position (position C) spaced apart by about λ/2, outward in the propagation direction of a surface acoustic wave, from the center of the electrode 13, i.e., the center of the electrode finger portions 13a and 13b in the propagation direction of a surface acoustic wave, is set at a designed position, and an edge is formed by performing cutting at a position on the inside or outside of the designed position. Herein, when cutting is performed at one of positions indicated by A to F, there is a possibility that the electrode finger portion 14b in the outermost electrode finger 14 is cut off.

Figure 6:
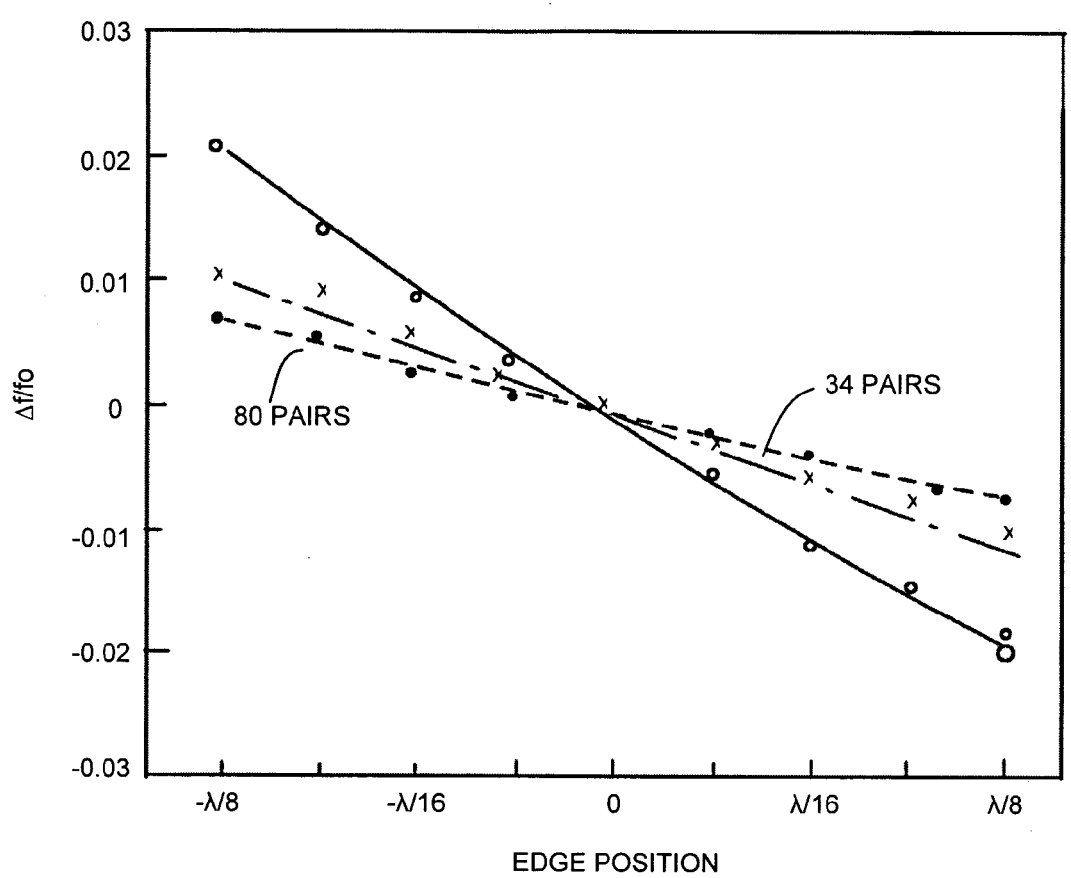
FIG. 6 is a diagram showing the relationship between the position of the edge formed by cutting, and the ratio of the deviation amount Δf of the measured center frequency from the target center frequency $f_0$ with respect to the target center frequency $f_0$, in the second preferred embodiment of the present invention.

FIG. 6 shows the variation in the resonant frequency when each of the edges is formed in the manner described above, and the position thereof is shifted from the designed position which gives a distance of about λ/2×N in the edge reflection type surface wave device 1. The results shown in FIG. 6 are obtained from the experiments wherein an interdigital transducer 12 having fifteen, thirty-four and eighty pairs of electrode fingers are disposed on a piezoelectric substrate constituted of PZT, respectively, and wherein λ is about 36 μm.

The vertical axis in FIG. 6 represents the ratio of the deviation amount $\Delta f = f_2 - f_0$ of the measured resonant frequency $f_2$ from the target resonant frequency $f_0$ with respect to the target resonant frequency $f_0$, and the horizontal axis represents the position of the end surface. The "0" on the horizontal axis means that the edge is positioned at the designed position (position C), which is spaced apart by about λ/2 from the center of the electrode finger portions 13a and 13b, outward in the propagation direction of a surface acoustic wave.

As can be seen from FIG. 6, in the edge reflection type reflector including the double electrode type interdigital transducer 12, the resonant frequencies vary in the same manner as the first preferred embodiment by shifting the position of each of the edges.

In the second preferred embodiment also, when each of the edges is formed at a position that is shifted too much from the designed position outward or inward, a significant spurious response occurs in the frequency characteristic.

Figure 7:
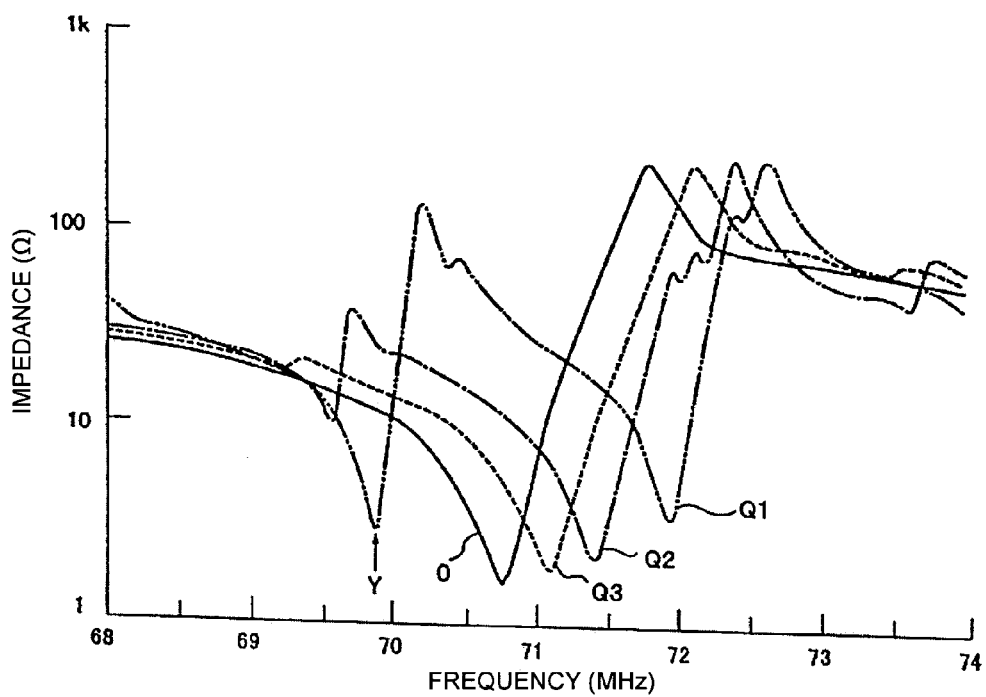
FIG. 7 is a diagram showing frequency characteristics when the positions of the edge are the designed position of $-\lambda/4$, the designed position of $-\lambda/8$, and the designed position of $-\lambda/16$, in the second preferred embodiment of the present invention.

The characteristic indicated by the arrow Q1 in FIG. 7 show the frequency characteristic when each of the edges is formed at the position shifted from the designed position by about −λ/4 along the propagation direction of a surface wave. As indicated by the arrow Y in the figure, a significant spurious response is observed.

The characteristic indicated by the arrow Q2 in FIG. 7 shows the frequency characteristic when each of the edges is located at the position that is shifted from the designed position by about −λ/8. It can been seen that the above-described spurious response has been considerably suppressed.

Also, the characteristic indicated by the arrow Q3 in FIG. 7 shows the frequency characteristic when each of the edges is located at the position that is shifted from the designed positions by about $-\lambda/16$. It is recognized that the above-described spurious response is suppressed more effectively when the position of each of the edges is within the range of about $\pm\lambda/16$ from the designed position.

In the second preferred embodiment also, therefore, it is confirmed that a superior frequency characteristic with low spurious response can be achieved by forming each of the edges at a position within the range of about $\pm\lambda/8$ from the designed position, more preferably, within the range of about $\pm\lambda/16$ therefrom.

Figure 8:
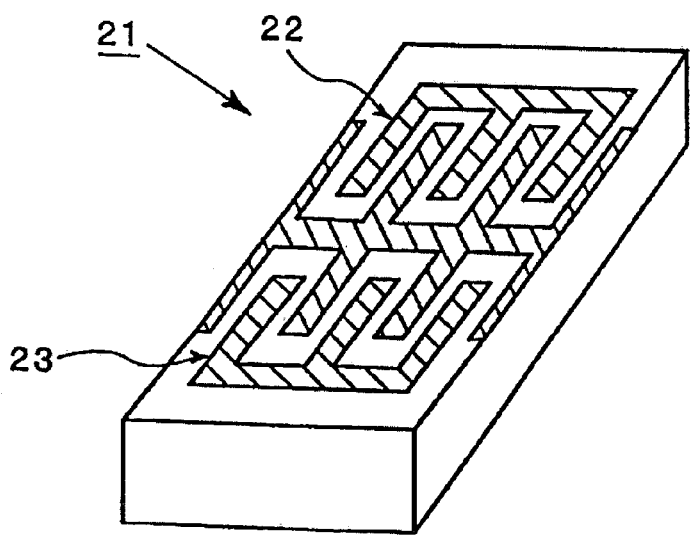
FIG. 8 is a perspective view showing a transversally coupled type surface wave filter including single electrode type interdigital transducers, as an example of surface acoustic wave device to which preferred embodiments of the present invention are applied.
Figure 14:
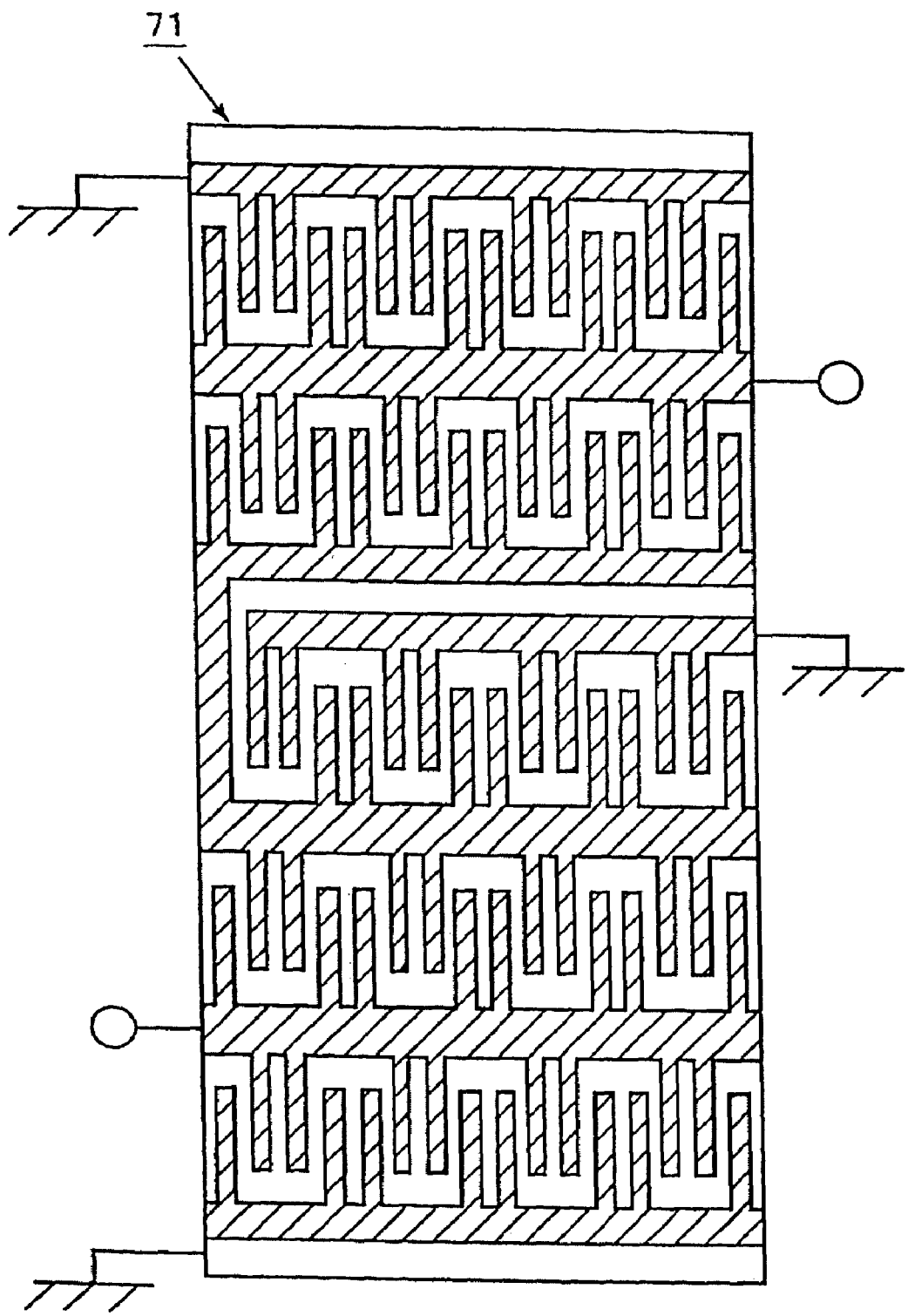
FIG. 14 is a plan view showing a ladder type filter including double electrode type interdigital transducers, as still another example of an end surface reflection type surface wave device to which preferred embodiments of the present invention are applied.

In the first and second preferred embodiments, descriptions have been made of the example of the surface wave resonator using a single electrode type interdigital transducer, and that of the surface wave resonator using a double electrode type interdigital transducer, respectively. The present invention, however, can be applied to a method for manufacturing various surface wave devices which include single electrode type and double electrode type transducers. FIGS. 8 and 14 shows other examples of surface wave devices to which preferred embodiments of the present invention is applied.

Figure 9:
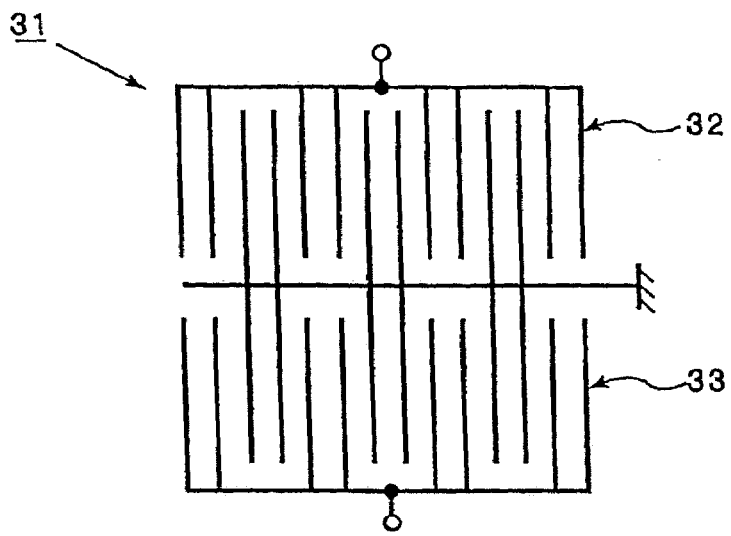
FIG. 9 is a schematic plan view showing a transversally coupled type surface wave filter including double electrode type interdigital transducers, as an example of surface wave device to which preferred embodiments of the present invention are applied.

Edge reflection type surface wave devices 21 and 31 illustrated in FIGS. 8 and 9 are transversally coupled type edge reflection type surface wave filters which have two single electrode type interdigital transducers 22 and 23, and two double electrode type interdigital transducers 32 and 33, respectively.

Figure 10:
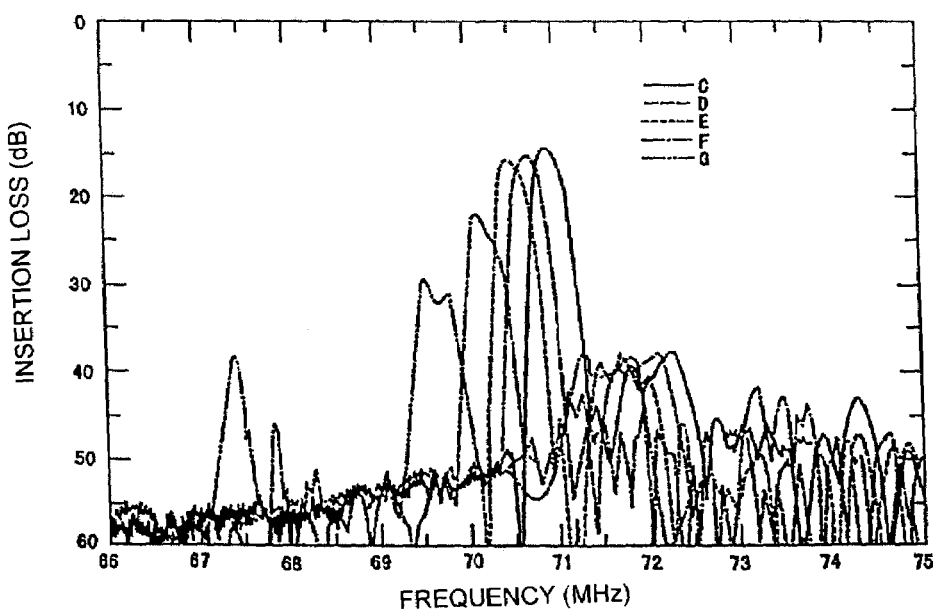
FIG. 10 is a diagram showing variations in the frequency characteristics in the transversally coupled type resonator filter including single electrode type interdigital transducers when the position of the edge is varied.

FIG. 10 illustrates characteristic examples of transversally coupled type resonator filter using a piezoelectric substrate preferably made of PZT, shown in FIG. 9. In FIG. 10, C indicates a characteristic when each of the edges is formed at the designed position, and D, E, F, and G indicate characteristics when each of the edges is formed at the positions shifted outside the designed position by about $\lambda/32$, $\lambda/16$, $\lambda/8$, and $\lambda/4$, respectively. As can be seen, the center frequency can be adjusted by varying the edge forming position. With respect to the filter characteristics, it is noticed that the insertion loss is very inferior and the spurious response are very large when each of the edges is formed at the position shifted outside the designed position by about $\lambda/4$. When the edge forming position is shifted outside the designed position by about $\lambda/8$, these filter characteristics exhibit moderate results, and when the forming position is shifted outside the designed position by about $\lambda/16$, the filter characteristics exhibit superior results. Although FIG. 10 shows the results of the case where the edge forming position is shifted outside the designed position, the shifting of the edge forming position inside the designed position allows the center frequency to be adjusted to shift toward a higher frequency. In this case, the insertion loss and the spurious response exhibits the same values as the case where the edge forming position is shifted outside the designed position. A longitudinally-coupled type resonator filter which will be described below also shows similar results.

Figure 11:
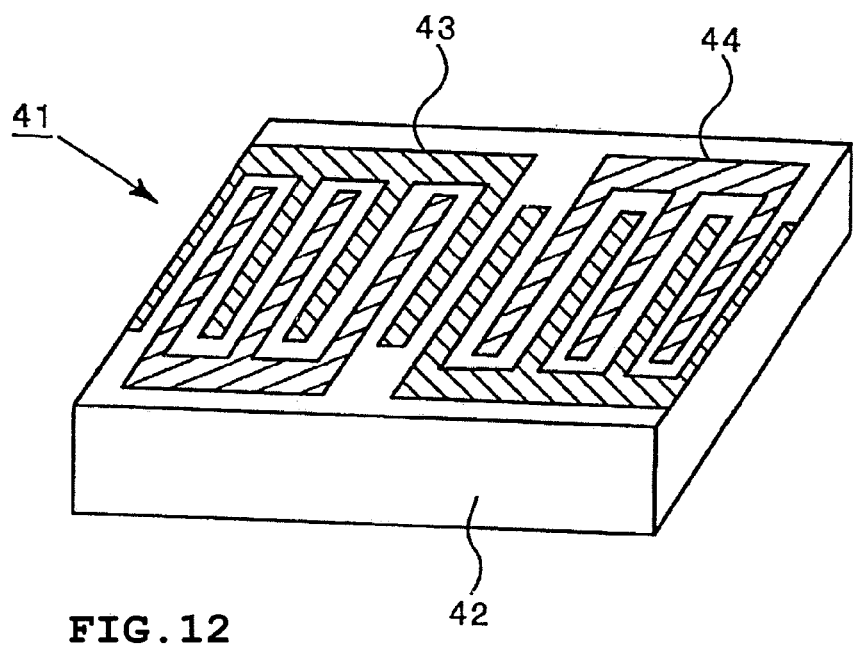
FIG. 11 is a perspective view showing a longitudinally-coupled type surface acoustic wave filter including single electrode type interdigital transducers, as another example of surface wave device to which preferred embodiments of the present invention are applied.

A surface wave device 41 shown in FIG. 11 is a longitudinally-coupled type surface acoustic wave filter wherein single electrode type interdigital transducers 43 and 44 are disposed on a piezoelectric substrate 42 along the propagation direction of a surface wave.

Figure 12:
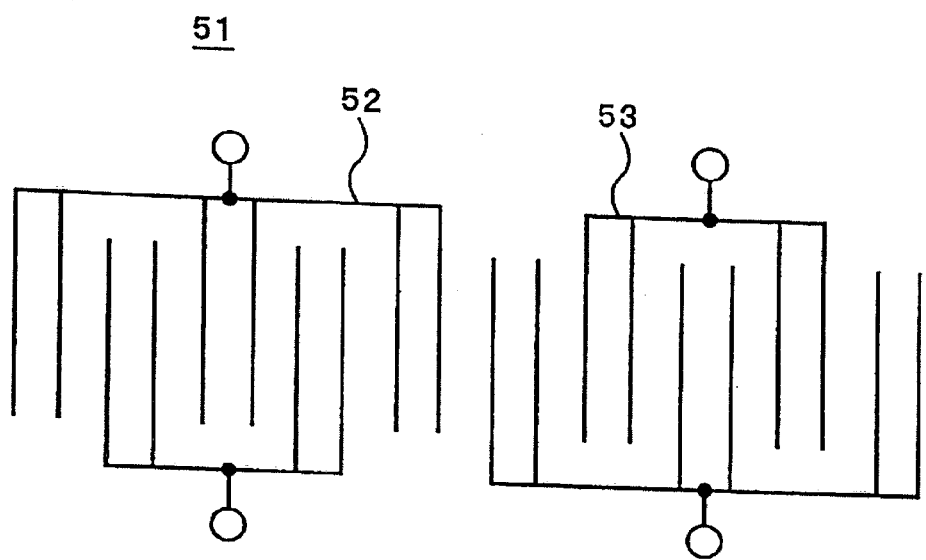
FIG. 12 is a schematic plan view showing the electrode configuration of a longitudinally-coupled type surface acoustic wave filter including double electrode type interdigital transducers, as still another example of a surface wave device to which preferred embodiments of the present invention are applied.

An edge reflection type surface wave device 51 shown in FIG. 12 is a longitudinally-coupled type surface acoustic wave filter having double electrode type interdigital transducers 52 and 53.

Figure 13:
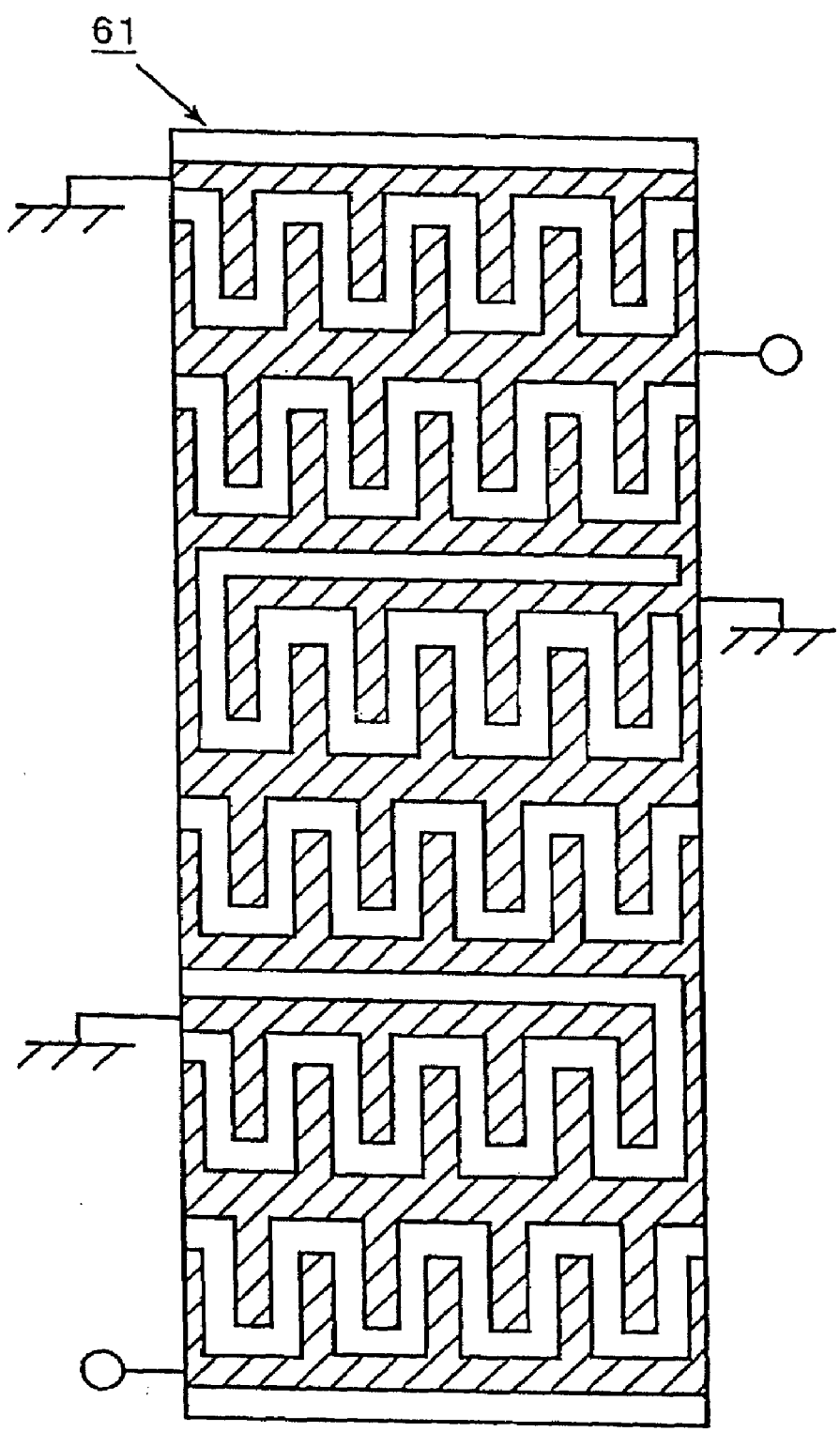
FIG. 13 is a plan view showing a ladder type filter including single electrode type interdigital transducers, as another example of an end surface reflection type surface wave device to which preferred embodiments of the present invention are applied.

Edge reflection type surface wave devices 61 and 71 shown in FIGS. 13 and 14 are ladder type filters having single electrode type interdigital transducers and double electrode type interdigital transducers, respectively.

The method for manufacturing an edge reflection type surface wave device in accordance with preferred embodiments of the present invention can generally be applied to the production of various edge reflection type surface wave devices besides the different edge reflection type surface wave devices shown in FIGS. 8 to 14 as described above.

As is evident from the foregoing, in the method for manufacturing an edge reflection type surface wave device in accordance with various preferred embodiments of the present invention, even when the deviation of the frequency characteristic due to wafers has occurred, an edge reflection type surface wave device which has an intended frequency characteristic can be easily achieved by measuring the characteristic of the edge reflection type surface wave device which has firstly been formed on the identical wafer, and by adjusting the edge forming position in the remaining edge reflection type surface wave devices on the identical wafer depending on the deviation of the obtained characteristic from the target characteristic.

In the first aspect of preferred embodiments of the present invention, each of the two opposing edges is formed by cutting the piezoelectric at a position within the range of about $+\lambda/8$ from the designed position, and thereby the frequency is adjusted to become lower. On the other hand, in the second aspect of preferred embodiments of the present invention, each of the two opposing edges is formed by cutting the piezoelectric at a position inside the designed position, for example, within the range of about $-\lambda/8$ from the designed position, and thereby the frequency is adjusted to become higher.

In the first or second aspect of preferred embodiments of the present invention, particularly when each of the edges is formed by performing cutting at a position within the range of the designed position of about $+\lambda/16$, or the designed position of about $-\lambda/16$, the unwanted spurious response is even more suppressed, thereby achieving a superior resonant characteristic or filter characteristic.

In the third and fourth aspects of preferred embodiments of the present invention also, after the interdigital transducer has been formed on the piezoelectric substrate, the position that is spaced apart by about $\lambda/2$, outward in the propagation direction of a surface acoustic wave, from the center of the electrode finger adjacent to each of the outermost electrode fingers, is set to be a designed position, and each of the two opposing edges is formed by performing cutting at a position within the range of the designed position of about $+\lambda/8$ or the designed position of about $-\lambda/8$. The unwanted spurious response, therefore, can be effectively suppressed, thereby achieving superior resonant characteristic or filter characteristic. Furthermore, when forming each of the edges by performing cutting at a position within the range of the designed position of about $+\lambda/8$ or the designed position of about $-\lambda/8$, the resonant frequency or the center frequency can be easily adjusted to become lower or higher by adjusting the position of each of the edges.

In the third or fourth aspects of preferred embodiments of the present invention also, when each of the edges is preferably formed by performing cutting within the range of the designed position of about $+\lambda/16$, or the designed position of about $-\lambda/16$, the unwanted spurious response can be more effectively suppressed.

While the present invention has been described with reference to what are at present considered to be preferred embodiments, it is to be understood that various changes and modifications may be made thereto without departing from the invention in its broader aspects and therefore, it is intended that the appended claims cover all such changes and modifications that fall within the true spirit and scope of the invention.

What is claimed is:

1. A method for producing an edge reflection type surface acoustic wave device which includes at least one interdigital transducer and utilizes a shear horizontal type surface wave, comprising the steps of:
    forming a plurality of interdigital transducers on a piezoelectric substrate;
    cutting the piezoelectric substrate and producing a reference edge reflection type surface acoustic wave device including at least one of the interdigital transducers and a pair of edges of the piezoelectric substrate, the pair of edges defining a predetermined distance therebetween;
    measuring a frequency characteristic of the reference edge reflection type surface acoustic wave;
    determining a deviation between the measured frequency characteristic and a desired frequency characteristic;
    determining positions of a pair of edges defining each of remaining edge reflection type surface acoustic wave devices based on the determined deviations so as to correct the deviation; and
    cutting the piezoelectric substrate at the determined positions to producing the remaining edge reflection type surface acoustic wave devices.

2. A method for producing an edge reflection type surface acoustic wave device according to claim 1, wherein in the position determining step, a distance between the pair of edges of the remaining edge reflection type surface acoustic wave devices is shorter than the predetermined distance when a final frequency characteristic of the remaining edge reflection type surface acoustic wave devices is to be higher than the measured frequency characteristic, and a distance between the pair of edges of the remaining edge reflection type surface acoustic wave devices is longer than the predetermined distance when a final frequency characteristic of the remaining edge reflection type surface acoustic wave devices is to be lower than the measured frequency characteristic.

3. A method for producing an edge reflection type surface acoustic wave device according to claim 2, wherein the positions of edges of the remaining edge reflection type surface acoustic wave devices are shifted from positions of the reference edges of the reference edge reflection type surface acoustic wave devices by about $\lambda/8$ or less, where the $\lambda$ is a wavelength of a shear horizontal type surface wave to be excited in the remaining edge reflection type surface acoustic wave device.

4. A method for producing and edge reflection type surface acoustic wave device according to claim 3, wherein the edge reflection type surface acoustic wave device comprises a single electrode type interdigital transducer.

5. A method for producing an edge reflection type acoustic wave device according to claim 3, wherein the edge reflection type surface acoustic wave device comprises a double electrode type interdigital transducer.

6. A method for producing an edge reflection type surface acoustic wave device according to claim 2, wherein the positions of edges of the remaining edge reflection type surface acoustic wave devices are shifted from positions of the reference edges of the reference edge reflection type surface acoustic wave devices by about $\lambda/16$ or less, where the $\lambda$ is wavelength of a shear horizontal type surface wave to be excited in the remaining edge reflection type surface acoustic wave device.

7. A method for producing an edge reflection type surface acoustic wave device according to claim 6, wherein the edge reflection type surface acoustic wave device comprises a single electrode type interdigital transducer.

8. A method for producing an edge reflection type surface wave device according to claim 6, wherein the edge reflection type surface acoustic wave device comprises a double electrode type interdigital transducer.

9. A method for producing an edge reflection type surface acoustic wave device according to claim 2, wherein the edge reflection type surface acoustic wave device comprises a single electrode type interdigital transducer.

10. A method for producing an edge reflection type surface acoustic wave device according to claim 9, wherein the positions of the edges which define the predetermined distance are located at approximate centers of electrodes.

11. A method for producing an edge reflection type surface acoustic wave device according to claim 2, wherein the edge reflection type surface acoustic wave device comprises a double electrode type interdigital transducer.

12. A method for producing an edge reflection type surface acoustic wave device according to claim 11, wherein each of the positions of the edges which define the predetermined distance is located at an approximate center of a pair of electrode fingers constituting a double electrode.

* * * * *